United States Patent [19]
O

[11] Patent Number: 5,432,114
[45] Date of Patent: Jul. 11, 1995

[54] PROCESS FOR INTEGRATION OF GATE DIELECTRIC LAYERS HAVING DIFFERENT PARAMETERS IN AN IGFET INTEGRATED CIRCUIT

[75] Inventor: Kenneth K. O, Boston, Mass.

[73] Assignee: Analog Devices, Inc., Norwood, Mass.

[21] Appl. No.: 327,656

[22] Filed: Oct. 24, 1994

[51] Int. Cl.⁶ ........................................ H01L 21/8238
[52] U.S. Cl. ................................. 437/56; 437/34; 437/57; 437/979
[58] Field of Search ................ 437/56, 34, 57, 58, 437/59; 148/DIG. 117, DIG. 118, 979

[56] References Cited

U.S. PATENT DOCUMENTS

| | | | |
|---|---|---|---|
| 4,635,347 | 1/1987 | Lien et al. | 437/43 |
| 4,859,619 | 8/1989 | Wu et al. | 437/56 |
| 4,866,002 | 9/1989 | Shizukuishi et al. | 437/57 |
| 5,057,449 | 10/1991 | Lowrey et al. | 437/979 |
| 5,254,489 | 10/1993 | Nakata | 148/DIG. 117 |

FOREIGN PATENT DOCUMENTS

| | | | |
|---|---|---|---|
| 63-289961 | 11/1988 | Japan | 437/57 |
| 2116156 | 4/1990 | Japan | 437/56 |
| 0498869 | 3/1992 | Japan | 437/34 |

Primary Examiner—Brian E. Hearn
Assistant Examiner—Michael Trinh
Attorney, Agent, or Firm—Wolf, Greenfield & Sacks

[57] ABSTRACT

A process for fabricating an IGFET integrated circuit having two gate dielectric layers with different parameters is provided. Typically, the process is used for fabrication of dual voltage CMOS integrated circuits. The integrated circuit may include high voltage transistors having a first gate dielectric thickness and low voltage transistors having a second gate dielectric thickness. A first gate dielectric layer and a first gate layer for the high voltage transistors are formed over active regions of a substrate. The device is patterned to expose low voltage transistor areas, and the first gate dielectric layer and the first gate layer are removed in the low voltage transistor areas. Then, a second gate dielectric layer and a second gate layer for the low voltage transistors are formed on the device. The device is patterned to expose the high voltage transistor areas, and the second gate dielectric layer and the second gate layer are removed in the high voltage transistor areas. The gate dielectric layers are protected against contamination during processing and do not come in contact with photoresist.

28 Claims, 8 Drawing Sheets

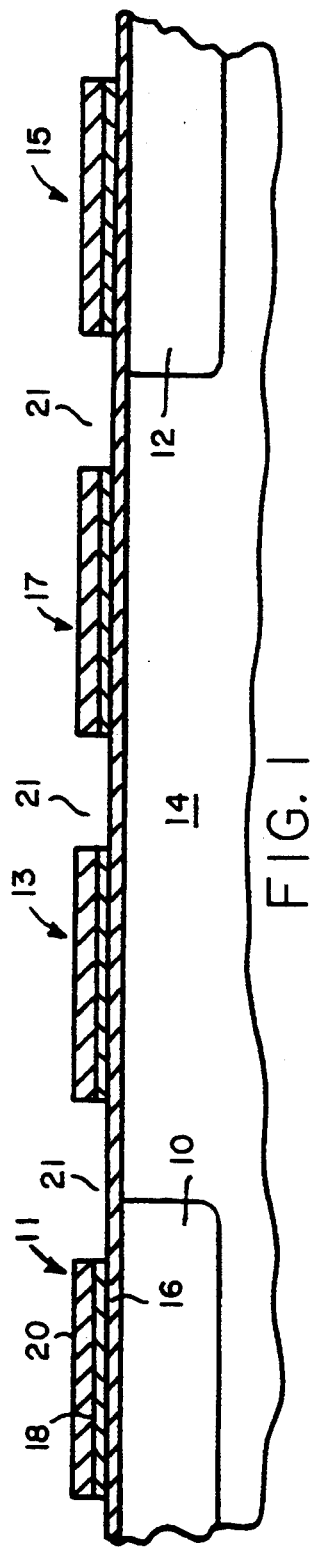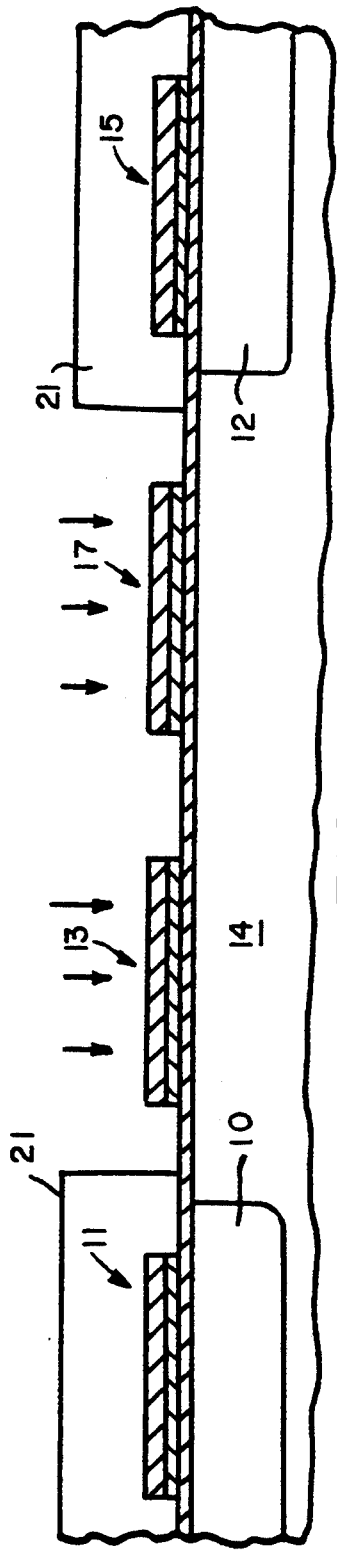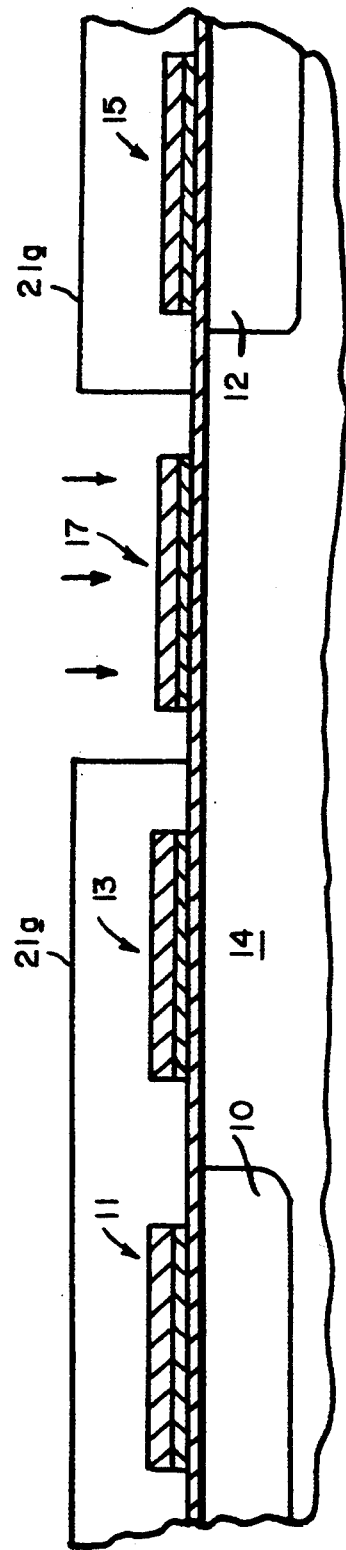

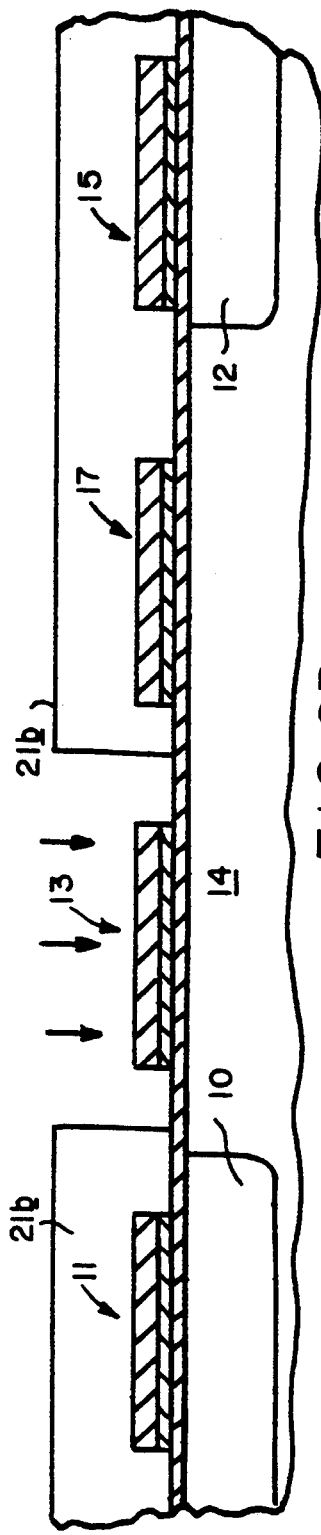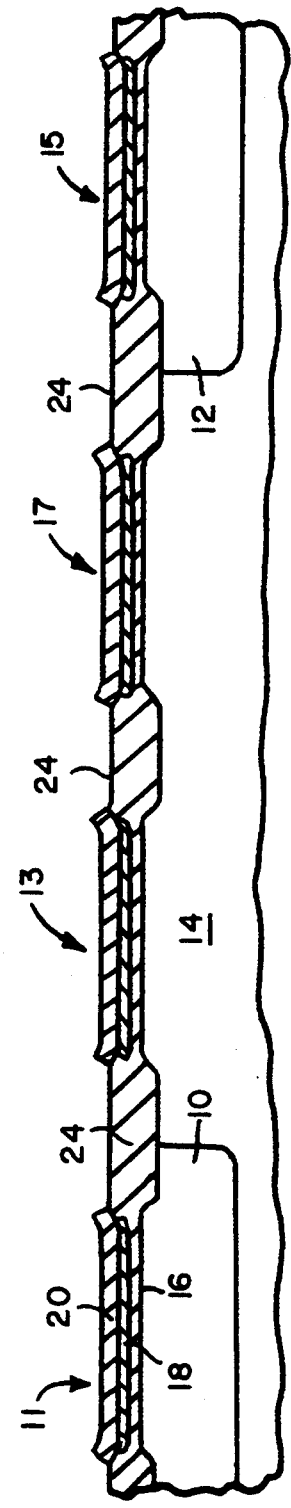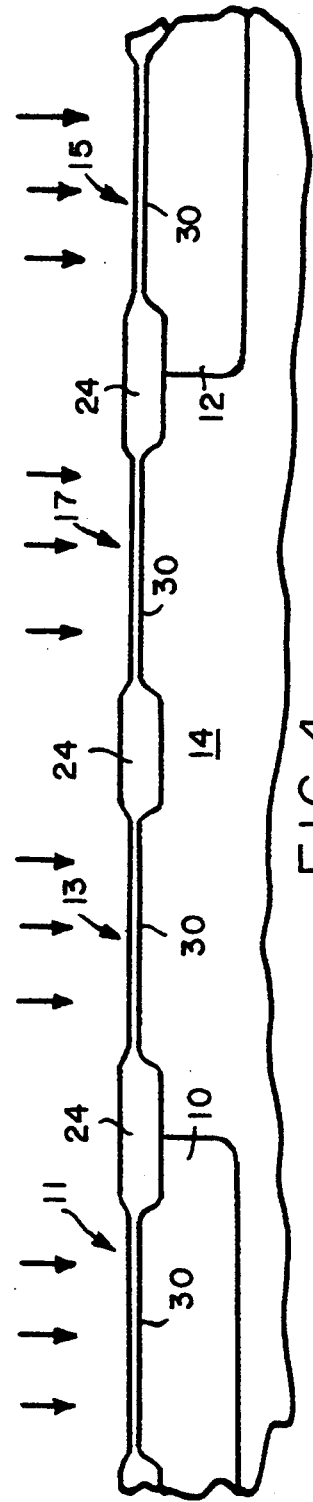

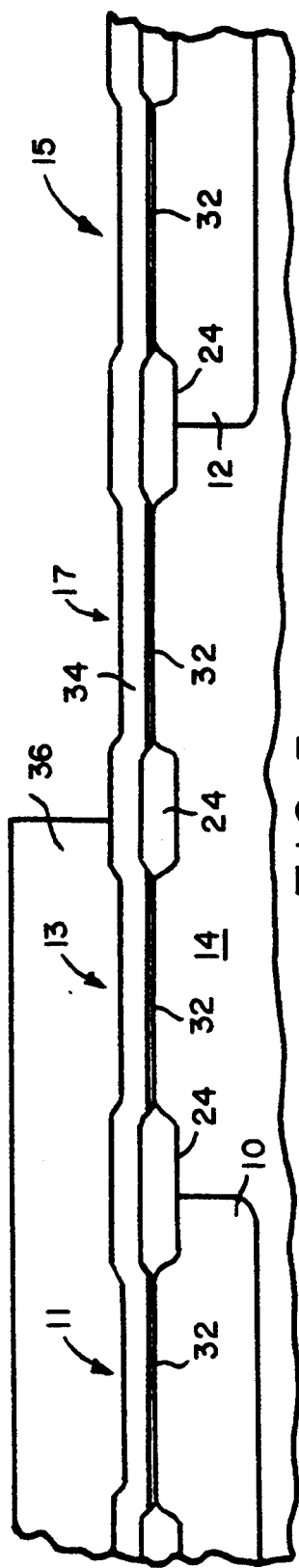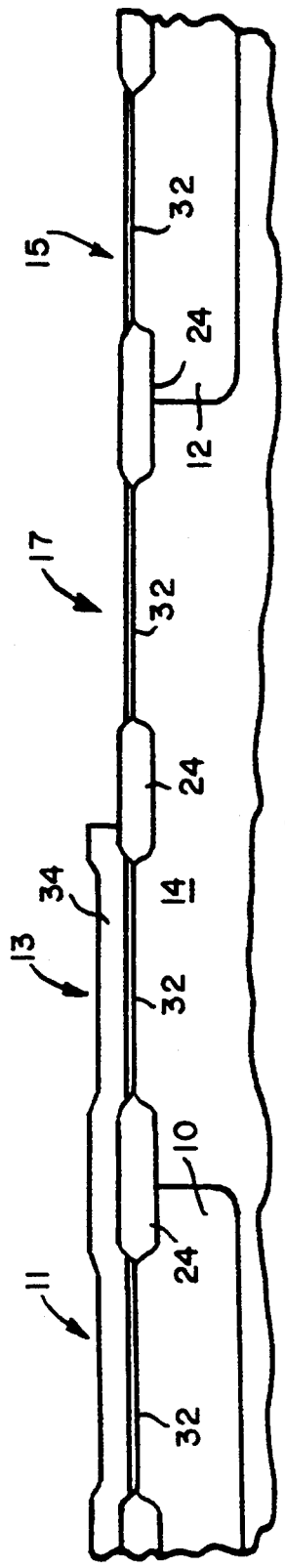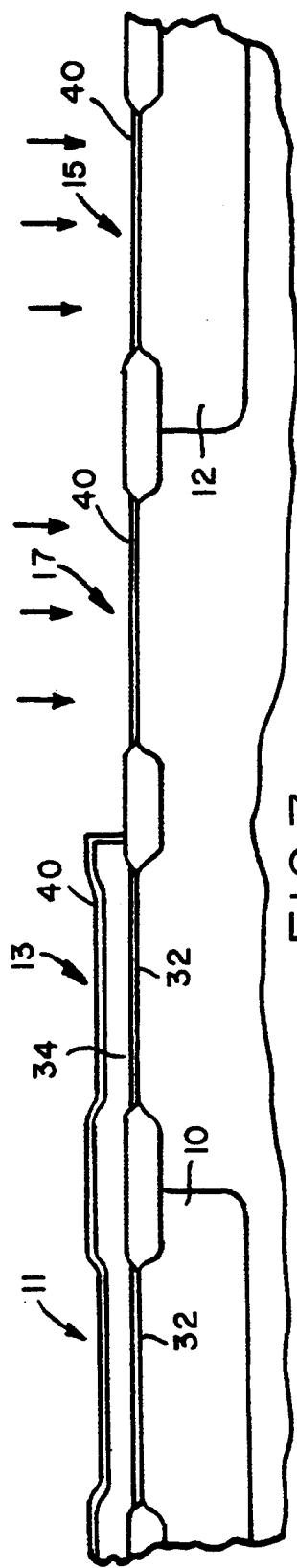

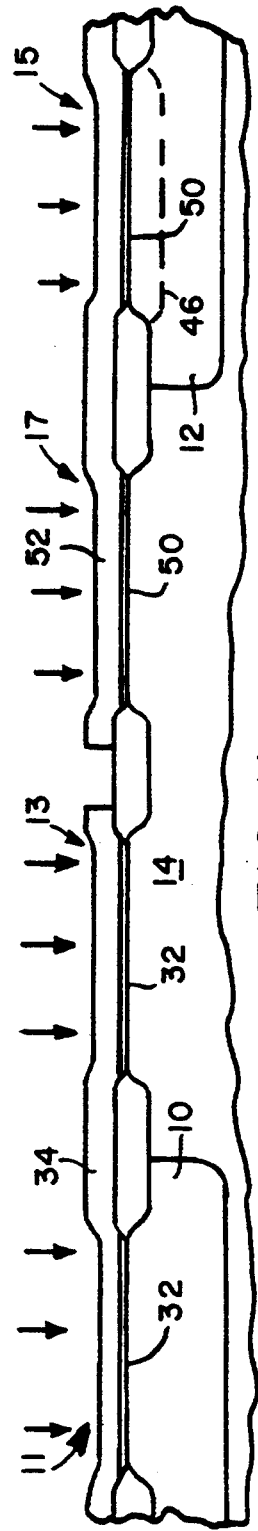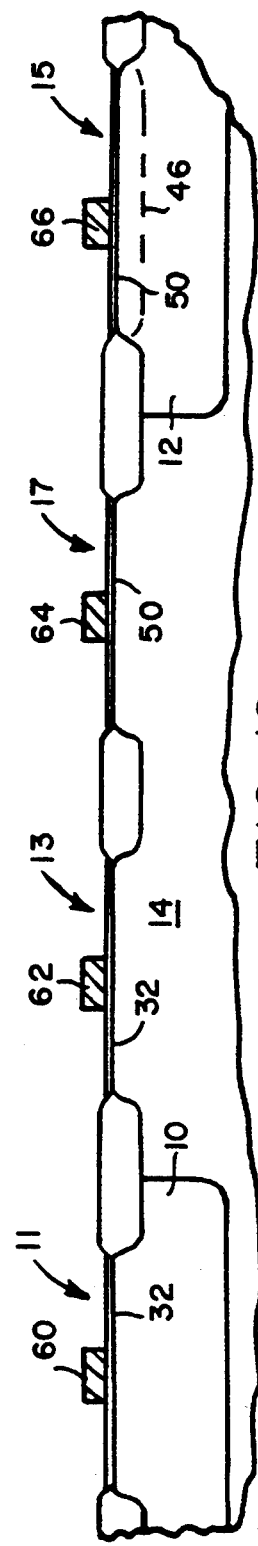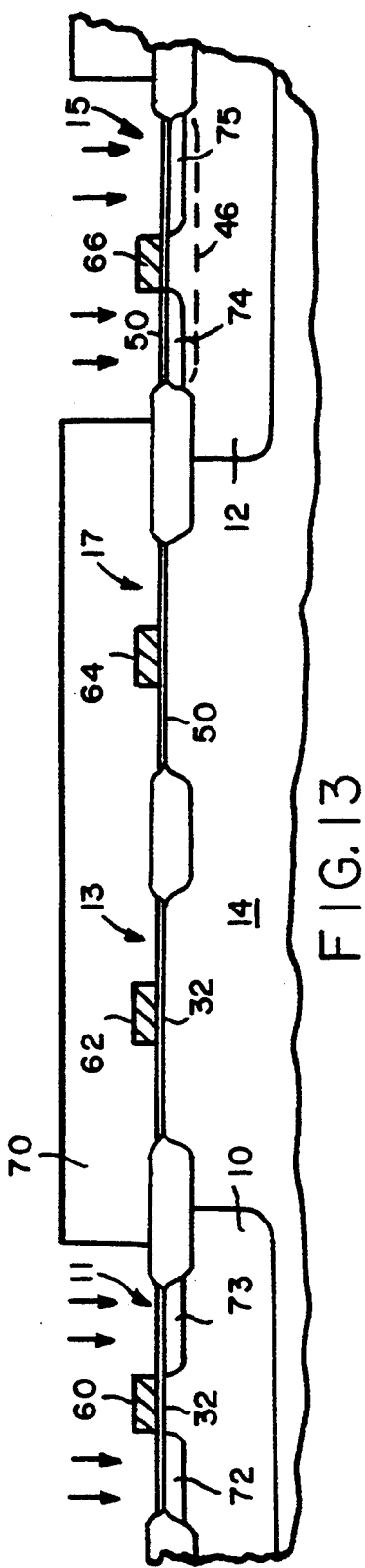

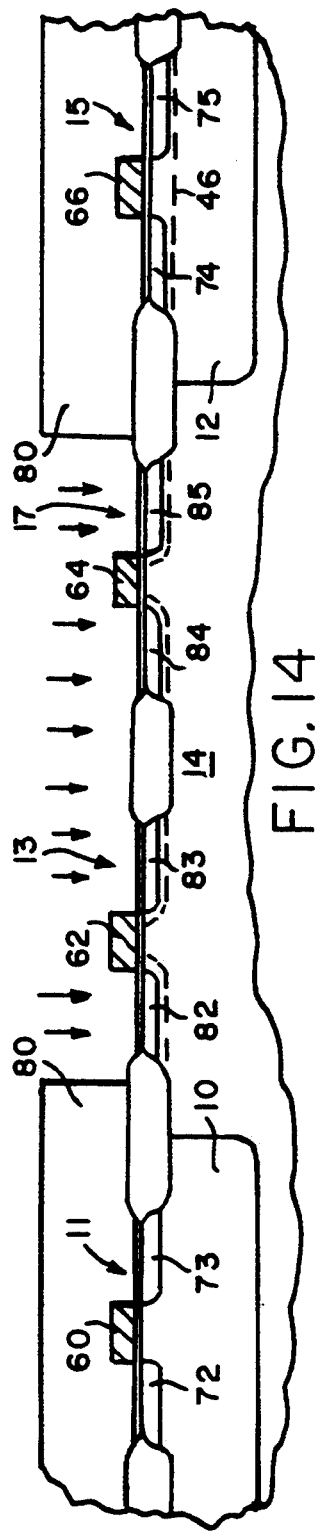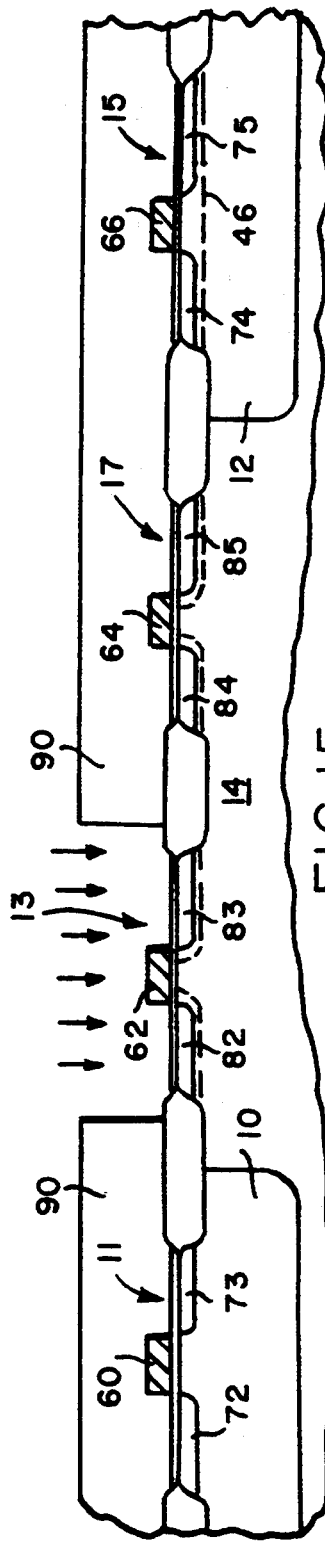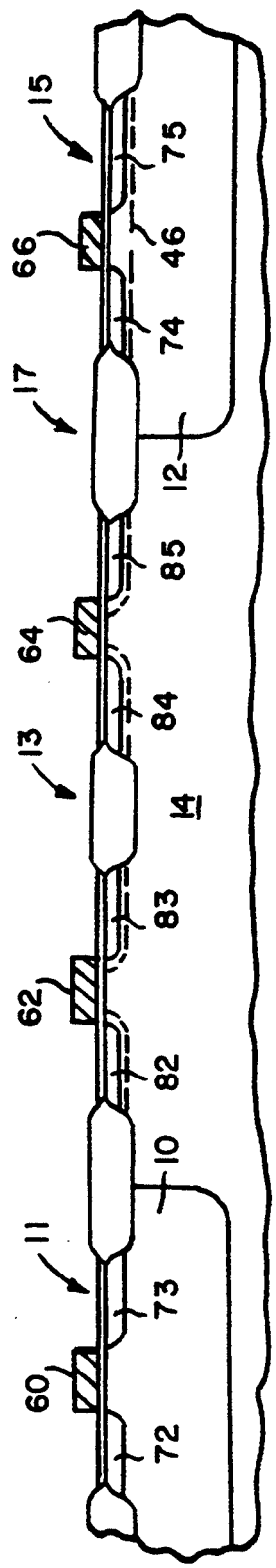

PROCESS FOR INTEGRATION OF GATE DIELECTRIC LAYERS HAVING DIFFERENT PARAMETERS IN AN IGFET INTEGRATED CIRCUIT

FIELD OF THE INVENTION

This invention relates to methods for fabricating insulated gate field effect transistor (IGFET) integrated circuits and, more particularly, to methods for fabricating gate dielectric layers having different parameters, such as different thicknesses and different compositions. The methods are preferably used in the fabrication of dual voltage CMOS integrated circuits, but are not limited to such use.

BACKGROUND OF THE INVENTION

Power supply voltages of 3.3 volts are being used for 0.5 micrometer linewidth CMOS technologies, rather than the 5.0 supply voltages of the preceding CMOS technologies, to improve reliability as well as to reduce system power consumption. For subsequent generations of CMOS technologies, a further reduction in power supply voltage and more frequent supply voltage scaling have been predicted.

Major challenges associated with this trend are finding reliable ways to maintain compatibility among systems and circuits operating at different power supply voltages and overcoming difficulties in operating circuits at lower voltages. The latter challenge is a severe constraint for analog and mixed analog-digital systems, especially for precision analog systems. Supply voltage compatibility can be maintained by designing 5 volt I/O circuits into 3.3 volt systems. Subsystems which are difficult to operate at 3.3 volts can be operated at 5 volts. These subsystems are integrated with the 3.3 volt systems. Thus, a single mixed signal CMOS integrated circuit (IC) may incorporate circuits which operate at 3.3 volts and circuits which operate at 5.0 volts.

CMOS transistors optimized for 3.3 volt operation have a thinner gate dielectric layer (typically silicon dioxide) than 5.0 volt transistors in order to reduce short channel effects and to increase the drive current capability of the transistors. When such transistors are operated in 5.0 volt I/O and analog circuits, problems include: (1) the gate oxide wearout phenomenon which limits the maximum operating electric field to 4 MV-cm$^{-2}$, as described by M. Kakumu et al in *IEEE Trans. Electron Devices*, Vol. 37, No. 5, May 1990, pages 1334–1342, and (2) hot electron induced degradation, as described by P. Cottrell et al in *IEEE Trans. Electron Devices*, Vol. ED-26, 1979, pages 520–533. Oxide wearout can be alleviated by less aggressively scaling the gate oxide thickness for 3.3 volt operation, but at a cost of compromised transistor performance and, consequently, reduced system performance. An approach which avoids this compromise between performance and reliability is integration of two gate oxide thicknesses, one optimized for 5.0 volt transistors and one optimized for 3.3 volt transistors.

A process for forming gate oxides of different thicknesses on a CMOS integrated circuit is disclosed in U.S. Pat. No. 5,047,358 issued Sep. 10, 1991 to Kosiak et al. The disclosed process requires photoresist to come in contact with one of the gate oxide layers, as well as requiring several processing steps between the first gate oxidation and polysilicon gate deposition steps. Thus, the disclosed approach is susceptible to contamination of the gate oxide layers. Other approaches to fabrication of CMOS integrated circuits having high voltage and low voltage transistors are disclosed in U.S. Pat. No. 4,628,341 issued Dec. 9, 1986 to Thomas and U.S. Pat. No. 5,024,960 issued Jun. 18, 1991 to Haken. Another process for forming dielectric layers of different thicknesses is disclosed by A. Ito et al in *IEEE Trans. Electron Devices*, Vol. 41, No. 7 Jul. 1994, pages 1149–1159.

SUMMARY OF THE INVENTION

According to the present invention, a method for fabricating an IGFET integrated circuit having transistors of a first type and transistors of a second type is provided. The method comprises the steps of defining active regions in a substrate, forming a first gate dielectric layer and a first gate layer for the first type transistors over the active regions, removing the first gate layer and the first gate dielectric layer in areas of the second type transistors, forming a second gate dielectric layer and a second gate layer for the second type transistors over the active regions, removing the second gate layer and preferably removing the second gate dielectric layer in areas of the first type transistors, doping the first and second gate layers, preferably simultaneously, with one or more desired impurities, patterning the first and second gate layers, preferably simultaneously, to form gates of desired dimensions for the first type and the second type transistors, and forming source and drain regions for the first type and second type transistors. The first type transistors may comprise transistors designed for operation at a relatively high voltage, such as 5.0 volts, and the second type transistors may comprise transistors designed for operation at a relatively low voltage, such as 3.3 volts, in a CMOS integrated circuit.

Preferably, the first gate dielectric layer and the second gate dielectric layer are formed by growing silicon dioxide of desired thicknesses over the active regions of the substrate. The gate dielectric layer for the high voltage transistors is preferably thicker than the gate dielectric layer for the low voltage transistors. The gate dielectric layers may have different compositions and, more generally, different parameters. The first gate layer and the second gate layer are preferably formed by depositing polysilicon over the active regions of the substrate.

The threshold voltages of the high voltage transistors are preferably adjusted prior to the step of forming the first gate dielectric layer. The threshold voltages of the low voltage transistors are preferably adjusted prior to the step of forming the second gate dielectric layer. In each case, the threshold voltages may be adjusted by growing a sacrificial oxide layer over the active regions, implanting ions of a desired doping impurity through the sacrificial oxide layer to set the threshold voltages, and removing the sacrificial oxide layer. Alternatively, the threshold voltages of the low voltage transistors can be adjusted by implanting ions of a desired doping impurity through the first gate dielectric layer. When the threshold voltages of the low voltage transistors are adjusted, the first gate layer acts as an implant mask to protect the high voltage transistor areas. The first gate layer is preferably removed by forming a photomask which exposes the areas of the low voltage transistors, and etching the first gate layer in the exposed areas of the low voltage transistors. Then the first gate dielectric layer is stripped in the exposed areas of the low voltage transistors. The second gate layer is preferably removed by forming a photomask which exposes the areas of the high voltage transistors, and etching the second gate layer in the areas of the high voltage transistors using an isotropic plasma etch with high selectivity over the second gate dielectric layer to prevent formation of unwanted spacers. The second gate dielectric layer functions as an etch stop during etching of the second gate layer. The second gate dielectric layer on the first gate layer may be stripped in the exposed areas of the high voltage transistors.

The gate dielectric layers do not come in contact with photoresist and are not subjected to any extra processing steps between formation of the gate dielectric layers and formation of the gate layers. As a result, the risk of contamination of the gate dielectric layers is significantly reduced.

BRIEF DESCRIPTION OF THE DRAWINGS

For a better understanding of the present invention, reference is made to the accompanying drawings which are incorporated herein by reference and in which:

FIGS. 1, 2, 2A, 2B and 3-16 are cross-sections of a substrate at selected stages as it is being processed in accordance with the present invention.

DETAILED DESCRIPTION

Figure 8:
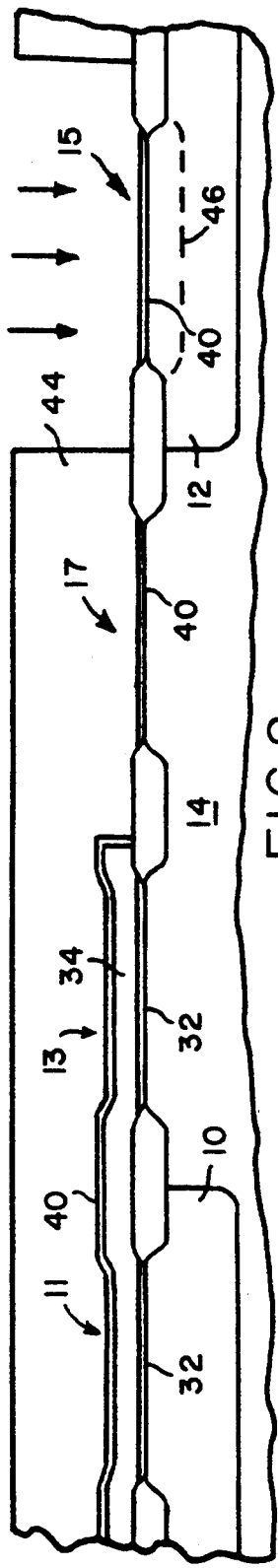

The process of the present invention is described with reference to FIGS. 1, 2, 2A, 2B and 3-16 in connection with fabrication of a dual voltage CMOS integrated circuit. However, the process of the present invention is not limited to CMOS integrated circuits and may be applied to any IGFET integrated circuit requiring gate dielectric layers having different parameters. FIGS. 1, 2, 2A, 2B and 3-16 illustrate the fabrication of high voltage PMOS and NMOS transistors and low voltage PMOS and NMOS transistors on a CMOS integrated circuit. The terms "high voltage" and "low voltage" are used herein only in a relative sense to differentiate between the operating voltages of different transistors on the CMOS integrated circuit. In the following example, the high voltage transistors are designed for operation at 5.0 volts, and the low voltage transistors are designed for operation at 3.3 volts. However, the process of the present invention is applicable to other operating voltages. FIGS. 1, 2, 2A, 2B and 3-16 illustrate the fabrication of the four transistor types (high voltage PMOS and NMOS transistors and low voltage PMOS and NMOS transistors) and are not necessarily representative of a particular circuit configuration. The patterning steps described below employ conventional photolithography techniques.

The CMOS integrated circuit is preferably fabricated on a $p^-/p^+$ epitaxial wafer starting with a twin well CMOS process. As shown in FIG. 1, n-wells 10 and 12 are formed on a substrate 14 by conventional implantation and drive-in steps. The n-wells 10 and 12 are preferably formed simultaneously for the 5.0 volt and 3.3 volt PMOS transistors. Then, a sandwich, including a thermal oxide layer 16, a polysilicon layer 18 and a silicon nitride layer 20, is formed and is patterned to expose LOCOS isolation areas 21. Preferably, the thermal oxide layer 16 has a thickness of 10 nanometers, the polysilicon layer 18 has a thickness of 50 nanometers and the silicon nitride layer 20 has a thickness of 200 nanometers. The patterned sandwich, including the thermal oxide layer 16, the polysilicon layer 18 and the silicon nitride layer 20, defines transistor areas, including a 5.0 volt PMOS transistor area 11, a 5.0 volt NMOS transistor area 13, a 3.3 volt PMOS transistor area 15 and a 3.3 volt NMOS transistor area 17. As noted above, specific transistor operating voltages are given by way of example only.

Then, the device is patterned for p-field and p-well implantation steps, as shown in FIG. 2. For these steps, a photoresist 21 is patterned to expose NMOS transistor areas 13 and 17. The p-wells are implanted with the implant energy set such that the ions penetrate into the substrate through the silicon nitride layer 20, the polysilicon layer 18 and the thermal oxide layer 16. The p-fields are implanted with the implant energy set such that the ions do not penetrate through these layers.

A second implementation of the p-field and p-well implantation steps is illustrated in FIGS. 2A and 2B. As shown in FIG. 2A, a photoresist 21a is patterned to expose only the 3.3 volt NMOS transistor area 17. The p-wells and the p-fields for the 3.3 volt NMOS transistor are implanted through the photomask defined by photoresist 21a. Then, the photoresist 21a is stripped from the device, and a photoresist 21b is patterned to expose the 5.0 volt NMOS transistor area 13, as shown in FIG. 2B. The p-wells and p-fields for the 5.0 volt NMOS transistor are implanted through the photomask defined by photoresist 21b. The implementation illustrated in FIGS. 2A and 2B permits separate implantation parameters for the p-wells and p-fields of the 5.0 volt NMOS transistor and the 3.3 volt NMOS transistor. A third implementation of the p-field and p-well implantation steps is described with reference to FIGS. 2 and 2A. As shown in FIG. 2, the photoresist 21 is patterned to expose NMOS transistor areas 13 and 17. The p-wells for the 5.0 volt NMOS transistor and the p-fields for both NMOS transistors are implanted through the photomask defined by photoresist 21. Then, the photoresist 21 is stripped from the device, and photoresist 21a is patterned to expose the 3.3 volt NMOS transistor area 17, as shown in FIG. 2A. An additional implant through the photomask defined by photoresist 21a produces a higher p-well doping in the 3.3 volt NMOS transistor area 17. This implementation requires three implants.

Following the p-field and p-well implantation steps, LOCOS oxide 24 is formed in LOCOS isolation areas 21, as shown in FIG. 3. The LOCOS oxide process is described in U.S. Pat. No. 4,541,167, which is hereby incorporated by reference. The LOCOS oxide 24 provides isolation between transistors. In an alternative implementation, the p-field and p-well implantation steps described above are performed after LOCOS oxide formation.

The silicon nitride layer 20, the polysilicon layer 18 and the thermal oxide layer 16 are stripped from the device, as shown in FIG. 4. A sacrificial oxide layer 30, preferably having a thickness of about 65 nanometers, is grown on the device, and boron ions are implanted through the sacrificial oxide layer 30 without a mask to set the threshold voltages for the 5.0 volt PMOS and NMOS transistors. The sacrificial oxide layer 30 is stripped from the device, and a 5.0 volt gate dielectric layer 32 is grown, as shown in FIG. 5. Preferably, the gate dielectric layer 32 is silicon dioxide having a thickness of about 16.5 nanometers for 5.0 volt operation. A 5.0 volt polysilicon gate layer 34 is deposited over the gate dielectric (oxide) layer 32. The polysilicon gate layer 34 preferably has a thickness of about 450 nanometers. By way of example, the gate oxide layer 32 can be formed in a 900° C. dry/wet/dry oxidation step, and the gate layer 34 can be deposited as LPCVD polysilicon at 625° C. It will be understood that other processes can be used for formation of the gate dielectric layer 32 and the gate layer 34. For example, the gate dielectric layer 32 can be a nitride layer or a nitride and oxide layer.

A photoresist 36 is applied to the device and is patterned to expose the 3.3 volt transistor areas 15 and 17, and the gate layer 34 is etched in the exposed areas, as shown in FIG. 6. During the patterning step, the 5.0 volt gate oxide layer 32 is protected by the gate layer 34 and does not come in contact with the photoresist 36.

The photoresist 36 is stripped from the device. Then, the 5.0 volt gate oxide layer 32 is stripped in the 3.3 volt transistor areas 15 and 17, and a sacrificial oxide layer 40 is grown over the device, as shown in FIG. 7. The sacrificial oxide layer 40 preferably has a thickness of about 10 nanometers. Alternatively, the gate oxide layer 32 can be used as a screen oxide in place of the oxide layer 40. Preferably, boron difluoride ions are implanted without a mask through the oxide layer 40 (or the oxide layer 32) to set the threshold voltages for the 3.3 volt NMOS and PMOS transistors. Implantation into the 5.0 volt transistor areas 11 and 13 is blocked by the polysilicon gate layer 34. Thus, the gate layer 34 acts as an implant mask to protect 5.0 volt transistor areas 11 and 13 during the threshold adjust step. The threshold voltages for the 3.3 volt NMOS and PMOS transistors are set by this implantation step and by the implantation step which sets the threshold voltages of the 5.0 volt transistors.

A photoresist 44 is applied to the device and is patterned, as shown in FIG. 8, to expose 3.3 volt PMOS transistor area 15, and the 3.3 volt PMOS transistor area 15 is implanted with an n-type dopant such as phosphorous to improve punchthrough characteristics. The result is a punchthrough implant region 46 in the 3.3 volt PMOS transistor area 15.

Figure 9:
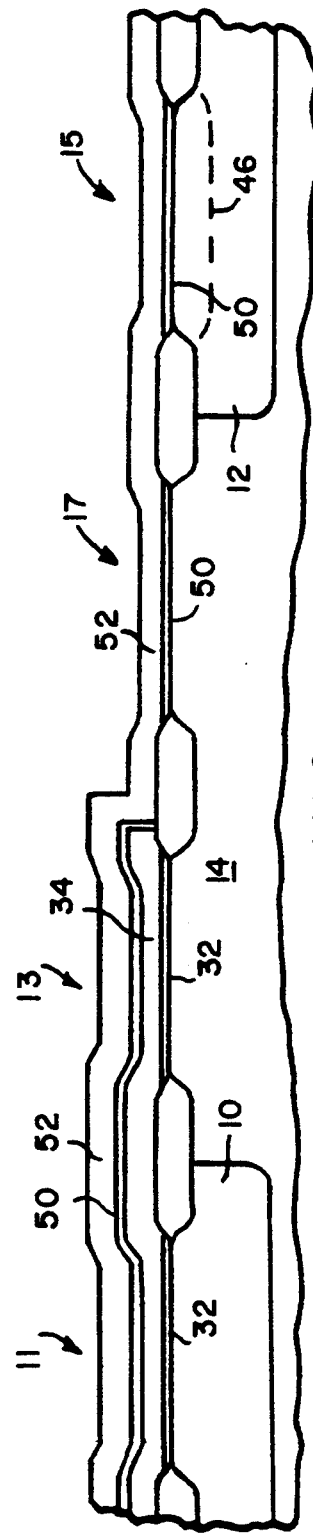

As shown in FIG. 9, the photoresist 44 and the sacrificial oxide layer 40 are stripped from the device. Then a 3.3 volt gate dielectric layer 50, preferably a silicon dioxide layer having a thickness of about 10 nanometers for 3.3 volt operation, is grown. During the gate oxidation step, oxide is also grown on the polysilicon gate layer 34 covering the 5.0 volt transistor areas 11 and 13. Forming the 3.3 volt transistors after the 5.0 volt transistors reduces thermal cycling of the 3.3 volt transistors and is preferred. However, the 3.3 volt transistors can be formed first. Following the formation of the 3.3 volt gate oxide layer 50, a 3.3 volt polysilicon gate layer 52, preferably having the same thickness as the polysilicon gate layer 34, is deposited. The 3.3 volt gate oxide layer 50 is preferably formed by a dry oxidation step at 900° C. The 3.3 volt polysilicon gate layer 52 can be formed by the same process as the 5.0 volt polysilicon gate layer 34.

Figure 10:
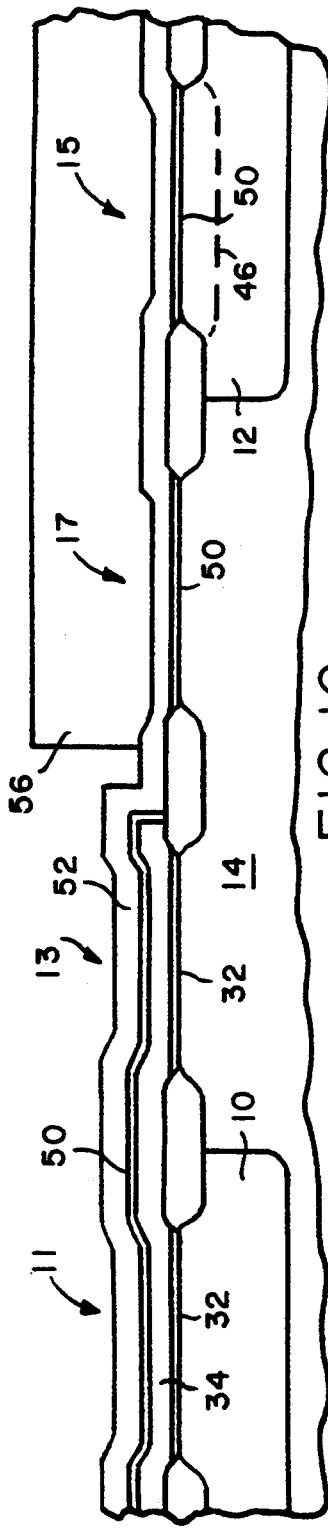

As shown in FIG. 10, a photoresist 56 is applied to the device and is patterned to expose the 3.3 volt polysilicon gate layer 52 in the 5.0 volt transistor areas 11 and 13. This is a coarse masking step, and the polysilicon gate layer 52 is preferably etched using an isotropic plasma etch with a high selectivity over oxide to prevent polysilicon spacer formation along the first polysilicon pattern. The 3.3 volt gate oxide layer 50 acts as an etch stop in the etching of 3.3 volt gate layer 52. In addition, the 3.3 volt gate oxide layer 50 is preferably etched in the 5.0 volt transistor areas 11 and 13.

As in the case of 5.0 volt gate oxide layer 32 and 5.0 volt polysilicon gate layer 34, the growth of 3.3 volt gate oxide layer 50 is immediately followed by the deposition of 3.3 volt polysilicon gate layer 52. Thus, the 5.0 volt gate oxide layer 32 and the 3.3 volt gate oxide layer 50 are both protected against contamination and do not come in contact with photoresist. The oxide reliability characteristics are expected to be comparable to those of separately fabricated 5.0 volt transistors and 3.3 volt transistors.

The gate dielectric layers 32 and 50 have been described above as having the same composition but different thicknesses. Alternatively, the gate dielectric layers 32 and 50 may have different compositions, such as, for example, silicon dioxide and silicon nitride, with the same or different thicknesses. More generally, the gate dielectric layers 32 and 50 may have different parameters, as desired.

An optional sacrificial oxide layer (not shown) may be grown over the device. Then the polysilicon gate layer 34 in the 5.0 volt transistor areas 11 and 13 and the polysilicon gate layer 52 in the 3.3 volt transistor areas 15 and 17 are n+ doped, preferably simultaneously, by implanting phosphorous, as shown in FIG. 11. If a sacrificial oxide layer was used, it is stripped after ion implantation in an oxide wet etch step. An annealing step may be used to remove implantation damage in the gate layers. If a silicided gate layer is desired, the silicide can be formed at this point. If silicided gate layers 34 and 52 are used, they can be thinner than specified above. The polysilicon gate layers 34 and 52 are patterned and etched, preferably simultaneously, to define 5.0 volt transistor gates 60 and 62, and 3.3 volt transistor gates 64 and 66, as shown in FIG. 12. The polysilicon gate etch is a conventional etch and does not have any additional requirements, such as a long overetch. This is possible because gate layers 34 and 52 are similar in thickness and etch characteristics.

As shown in FIG. 13, a photoresist 70 is applied to the device and is patterned to expose 5.0 volt PMOS transistor area 11 and 3.3 volt PMOS transistor area 15. The source/drain regions 72, 73, 74 and 75 of the PMOS transistors are formed, preferably simultaneously, by implanting boron difluoride.

As shown in FIG. 14, the photoresist 70 is stripped from the device, and a photoresist 80 is applied to the device and is patterned to expose 5.0 volt NMOS transistor area 13 and 3.3 volt NMOS transistor area 17. Source/drain regions 82, 83, 84 and 85 of the NMOS transistors are preferably formed as a double implanted drain (DID) structure consisting of relatively lightly doped deep phosphorous regions and relatively heavily doped shallow arsenic regions. The drains may also be formed as a lightly doped drain (LDD) structure.

An optional process step is illustrated in FIG. 15. The photoresist 80 is stripped from the device, and a photoresist 90 is applied to the device and is patterned to expose the 5.0 volt NMOS transistor area 13. The source/drain regions 82 and 83 of the 5.0 volt NMOS transistor are implanted by higher energy phosphorous ions for improved hot electron immunity. As shown in FIG. 16, the photoresist 90 is stripped from the device, leaving the device ready for deposition of dielectric and formation of metal interconnects in accordance with conventional techniques.

Figure 17:
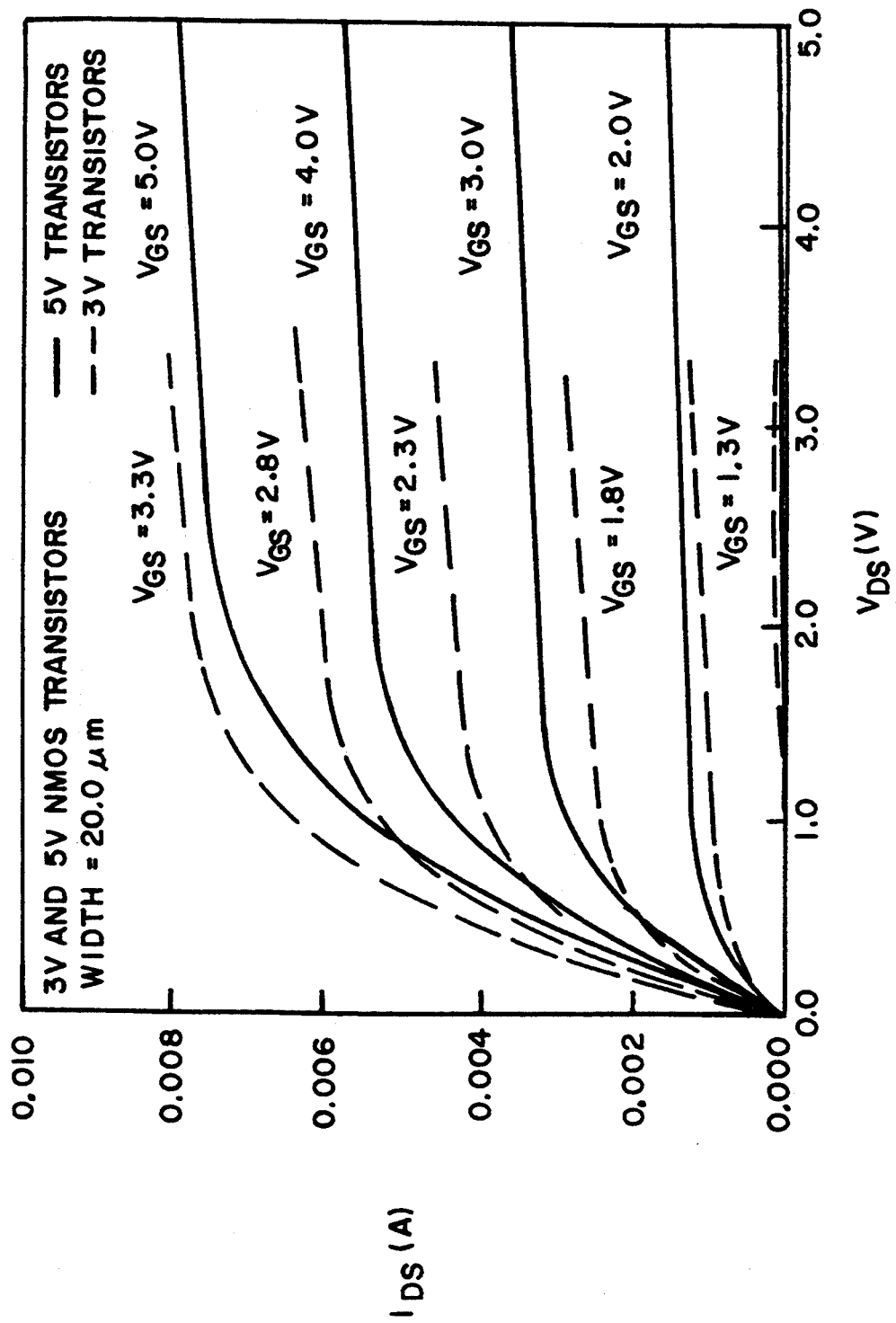
FIGS. 17 and 18 are graphs of drain-source current as a function of drain-source voltage, illustrating output characteristics of NMOS transistors and PMOS transistors, respectively, fabricated in accordance with the present invention, for different gate-source voltages.
Figure 18:
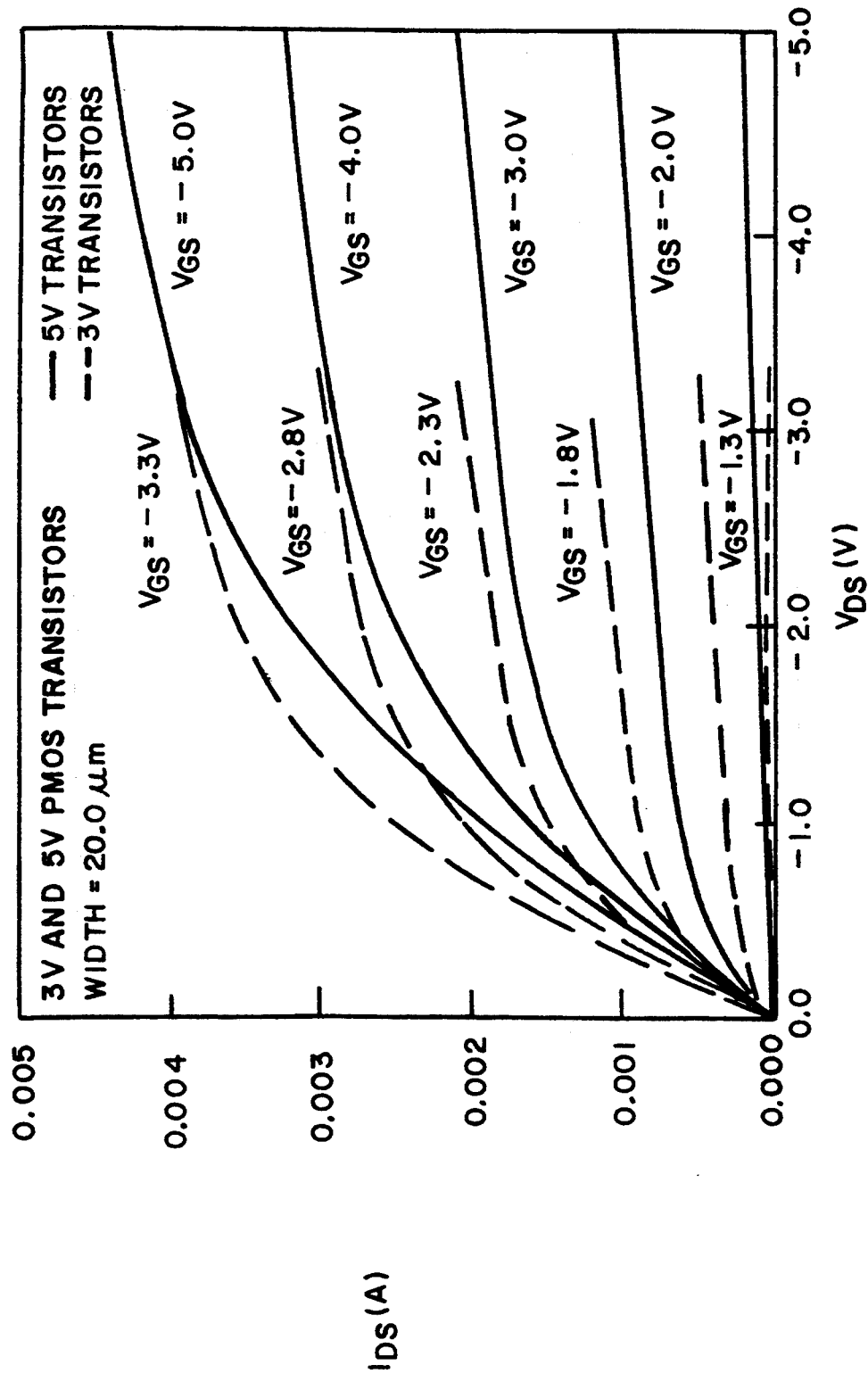

FIG. 17 shows the output characteristics of the 3.3 volt and 5.0 volt NMOS transistors, and FIG. 18 shows the output characteristics of the 3.3 volt and 5.0 volt PMOS transistors. The output characteristics are comparable to those of separately fabricated 3.3 volt and 5.0 volt CMOS transistors. The threshold voltages of the 3.3 volt NMOS transistors, the 5.0 volt NMOS transistors, the 3.3 volt PMOS transistors and the 5.0 volt PMOS transistors are 0.69, 0.84, −0.87 and −0.75 volt, respectively. The drain currents per unit width at the $V_{GS}$ and $V_{DS}$ of the respective power supply voltages (3.3 volts, 5.0 volts) are 410 microamps per micrometer, 400 microamps per micrometer, −185 microamps per micrometer, and −215 microamps per micrometer, respectively. The effective channel lengths of the 3.3 volt NMOS transistors, 5.0 volt NMOS transistors, 3.3 volt PMOS transistors, and 5.0 volt PMOS transistors are 0.45, 0.60, 0.55 and 0.70 micrometers, respectively. The peak substrate currents for the 3.3 volt NMOS transistors at $V_{DS}$ of 3.6 volts and 5.0 volt NMOS transistors at $V_{DS}$ of 5.5 volts are about 600 nanoamps per micrometer and about 3.0 microamps per micrometer (with the optional deeper source/drain phosphorous implantation), respectively, which suggests that the NMOS transistors have reasonable hot electron resistance.

The integration of two different gate oxide layers adds two coarse, noncritical alignment masking steps, one polysilicon deposition step, one implant step, two plasma polysilicon etch steps, and two thin oxide growth steps. In this method, the thin gate oxide layers are not exposed to photoresist, and, since the 3.3 volt and 5.0 volt polysilicon gates are patterned simultaneously, the integration does not add any patterning steps with critical dimension control requirements. Since the gate oxide layers do not come in contact with photoresist and are not subjected to any extra processing steps between the oxide growth and polysilicon gate deposition steps, the risk of contamination of the gate oxide layers is significantly reduced.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for fabricating an IGFET integrated circuit having transistors of a first type and transistors of a second type, comprising the steps of:
   providing a substrate;
   defining active regions in said substrate;
   forming a first gate dielectric layer over said active regions for said first type transistors;
   forming a first gate layer over said first gate dielectric layer for said first type transistors;
   removing said first gate layer and said first gate dielectric layer in areas of said second type transistors;
   forming a second gate dielectric layer over said active regions for said second type transistors and over remaining portions of said first gate layer;
   forming a second gate layer over said second gate dielectric layer for said second type transistors;
   removing said second gate layer in areas of said first type transistors;
   doping said first and second gate layers with one or more desired impurities;
   patterning said first and second gate layers to form gates of desired dimensions for said first type and second type transistors; and
   forming source and drain regions for said first type and second type transistors.

2. A method as defined in claim 1 wherein said first type transistors comprise high voltage transistors and said second type transistors comprise low voltage transistors.

3. A method as defined in claim 1 wherein said steps of forming said first gate dielectric layer and forming said second gate dielectric layer comprise growing silicon dioxide of desired thicknesses over the active regions of said substrate.

4. A method as defined in claim 1 wherein the steps of forming said first gate layer and forming said second gate layer comprise depositing polysilicon over the active regions of said substrate.

5. A method as defined in claim 2 wherein the step of removing said first gate layer and said first gate dielectric layer includes forming a patterned photoresist by photolithography such that the areas of said low voltage transistors are exposed, etching said first gate layer in the areas of said low voltage transistors, and stripping said first gate dielectric layer in the areas of said low voltage transistors.

6. A method as defined in claim 2 wherein the step of removing said second gate layer includes forming a patterned photoresist by photolithography such that the areas of said high voltage transistors are exposed, and etching said second gate layer in the areas of said high voltage transistors using an isotropic etch with high selectivity over said second gate dielectric layer.

7. A method as defined in claim 6 wherein said second gate dielectric layer functions as an etch stop during the step of etching said second gate layer.

8. A method as defined in claim 6 further including the step of removing said second gate dielectric layer in the areas of said high voltage transistors after the step of removing said second gate layer.

9. A method as defined in claim 2 further including the step of adjusting threshold voltages of said high voltage transistors prior to the step of forming said first gate dielectric layer.

10. A method as defined in claim 2 further including the step of adjusting threshold voltages of said low voltage transistors prior to the step of forming said second gate dielectric layer.

11. A method as defined in claim 10 wherein the step of adjusting threshold voltages of said low voltage transistors includes the steps of growing a sacrificial oxide layer over said active regions, implanting ions of a desired impurity through said sacrificial oxide layer to set the threshold voltages, and removing said sacrificial oxide layer.

12. A method as defined in claim 10 wherein said first gate layer functions as an implant mask to protect the areas of said high voltage transistors during the step of adjusting the threshold voltages of said low voltage transistors.

13. A method as defined in claim 10 wherein the step of adjusting threshold voltages of said low voltage transistors includes the step of implanting ions of a desired impurity through said first gate dielectric layer.

14. A method as defined in claim 2 wherein the steps of forming said first gate dielectric layer and forming said second gate dielectric layer are implemented such that said first gate dielectric layer is thicker than said second gate dielectric layer.

15. A method as defined in claim 14 wherein said first gate dielectric layer has a thickness selected for operation of said high voltage transistors at about 5 volts and said second gate dielectric layer has a thickness selected for operation of said low voltage transistors at about 3.3 volts.

16. A method as defined in claim 1 wherein the steps of forming said first gate dielectric layer and forming said second gate dielectric layer are implemented such that said first gate dielectric layer and said second gate dielectric layer have different parameters.

17. A method as defined in claim 2 wherein said low voltage transistors include p-type IGFET transistors and n-type IGFET transistors and further including the steps of forming a photomask to expose said low voltage p-type IGFET transistors, and implanting said low voltage p-type IGFET transistors with an n-type dopant to improve punchthrough characteristics.

18. A method as defined in claim 1 wherein the step of defining active regions includes the steps of forming n-wells in said substrate, growing a field oxide for transistor isolation and forming p-wells in said substrate.

19. A method as defined in claim 2 wherein said high voltage transistors include p-type IGFET transistors and n-type IGFET transistors and wherein the step of forming source and drain regions includes the steps of forming a photomask to expose said high voltage n-type IGFET transistors and implanting said high voltage n-type IGFET transistors with high energy phosphorous ions for improved hot electron immunity.

20. A method as defined in claim 1 wherein the step of patterning said first and second gate layers is performed such that the gates for said first type transistors and said second type transistors are formed simultaneously.

21. A method as defined in claim 1 wherein the step of doping said first and second gate layers is performed such that said first gate layer and said second gate layer are doped simultaneously.

22. A method as defined in claim 1 wherein said first type transistors and said second type transistors include p-type IGFET transistors and n-type IGFET transistors and wherein the step of forming source and drain regions is performed such that the source and drain regions of the p-type IGFET transistors of said first and second type transistors are formed simultaneously.

23. A method as defined in claim 1 wherein said first type transistors and said second type transistors include p-type IGFET transistors and n-type IGFET transistors and wherein the step of defining active regions in said substrate includes forming n-wells for the p-type transistors of said first and second type transistors simultaneously.

24. A method for fabricating an IGFET integrated circuit having high voltage transistors and low voltage transistors, comprising the steps of:

providing a substrate;

defining active regions in said substrate;

forming a first gate dielectric layer over said active regions for said high voltage transistors;

forming a first gate layer over said first gate dielectric layer for said high voltage transistors;

forming a photomask to expose areas of said low voltage transistors;

removing said first gate layer and said first gate dielectric layer in the areas of said low voltage transistors;

forming a second gate dielectric layer over said active regions for said low voltage transistors and over remaining portions of said first gate layer;

forming a second gate layer over said second gate dielectric layer for said low voltage transistors;

forming a photomask to expose areas of said high voltage transistors;

removing said second gate layer in the areas of said high voltage transistors;

doping said first and second gate layers with one or more desired impurities;

patterning said first and second gate layers to form gates for said high voltage and low voltage transistors; and forming source and drain regions for said high voltage and low voltage transistors.

25. A method as defined in claim 24 further including the steps of adjusting the threshold voltages of said high voltage transistors prior to the step of forming said first gate dielectric layer and adjusting the threshold voltages of said low voltage transistors prior to the step of forming said second gate dielectric layer.

26. A method as defined in claim 24 wherein the steps of forming said first gate dielectric layer and forming said second gate dielectric layer are implemented such that said first gate dielectric layer is thicker than said second gate dielectric layer.

27. A method as defined in claim 24 wherein the steps of forming said first gate dielectric layer and forming said second gate dielectric layer are implemented such that said first gate dielectric layer and said second gate dielectric layer have different parameters.

28. A method as defined in claim 24 further including the step of removing said second gate dielectric layer in the areas of said high voltage transistors after the step of removing said second gate layer.

* * * * *